United States Patent [19]

Aktik

[11] Patent Number: 4,866,499
[45] Date of Patent: Sep. 12, 1989

[54] PHOTOSENSITIVE DIODE ELEMENT AND ARRAY

[75] Inventor: Metin Aktik, Bromont, Canada

[73] Assignee: Mitel Corporation, Ontario, Canada

[21] Appl. No.: 284,818

[22] Filed: Dec. 14, 1988

Related U.S. Application Data

[63] Continuation of Ser. No. 908,666, Sep. 17, 1986, abandoned.

[30] Foreign Application Priority Data

Mar. 24, 1986 [CA] Canada .................................. 504872

[51] Int. Cl.$^4$ ............................................. H01L 27/14
[52] U.S. Cl. ........................................ 357/30; 357/15; 357/32; 357/24; 358/212
[58] Field of Search ................. 250/211 J; 357/15, 24, 357/24 LR, 30 C, 30 K, 30 M, 32, 33, 52, 59 B, 59 C, 63; 358/212

[56] References Cited

U.S. PATENT DOCUMENTS

| | | | |
|---|---|---|---|
| 3,604,987 | 9/1971 | Assour | 357/32 |
| 3,902,066 | 8/1975 | Roosild et al. | 357/32 |
| 4,246,043 | 1/1981 | Lindmayer | 357/52 |
| 4,485,389 | 11/1984 | Ovshinsky et al. | 357/30 |
| 4,633,031 | 12/1986 | Todorof | 353/30 |

OTHER PUBLICATIONS

Aktik et al; "High Efficiency a-Si:H MIS Solar Cells"; Dept. de geme physique Ecole Polytechnique; Montreal, Canada.
M. Aktik et al., "Density of States in Amorphous Silicon Produced by Microwave Glow Discharge", J. Appln. Phys., 53 (1) (1982), pp. 439–441.
C. Aktik et al., "Amorphous Silicon Prepared by Plasma Decomposition; Properties and Schottky Devices", Proceedings of the First Canadian Semiconductor Technology Conference, Ottawa, Canada (1982), pp. 153–160.
M. Aktik et al., "Schottky Devices Prepared with A—Si:H Glow Discharge Films", Proceedings of Energex, Regina, Canada (1982).
C. Aktik et al., "A Novel Doping Procedure for a—Si:H", J. Non Crys. Sol., 59–60 (1983), pp. 309–312.
C. Aktik et al., "High Efficiency a-Si:H MIS Solar Cells", Proceedings of the 10th Conference of Solar Energy Society of Canada, SESCI 84, Calgary.
C. Aktik et al., "Progress in Amorphous-Silicon Photovoltaic-device Research", Canada J. Phys., 63 (1985), pp. 786–797.

Primary Examiner—William L. Sikes
Assistant Examiner—B. R. R. Holloway
Attorney, Agent, or Firm—Antonelli, Terry & Wands

[57] ABSTRACT

A photosensitive diode element and method of manufacture. The diode element is comprised of a first layer of n-type hydrogenated amorphous-silicon forming a cathode, and a second layer of p+ type material forming an anode, the second layer overlying the first layer and being transparent to optical energy. As a result of using hydrogenated amorphous-silicon, the phtosensitive diode element according to the present invention has characteristics of high photoconductivity, controllably variable optical gap, and thin film structure. A photosensitive diode array formed from the subject diode elements is easily fabricated, employs straightforward circuitry for addressing each diode element, and is characterized by low crosstalk between elements, maximized optical sensitivity and broad dynamic range.

22 Claims, 2 Drawing Sheets

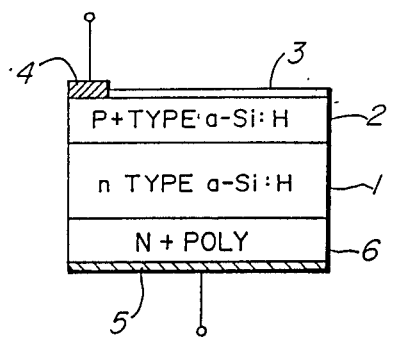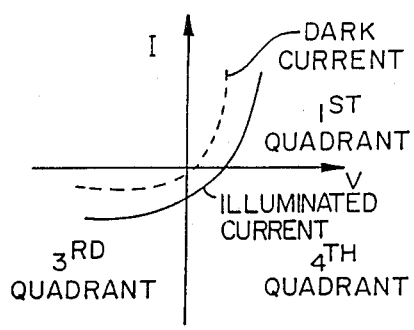
FIG. 1A  FIG. 1B
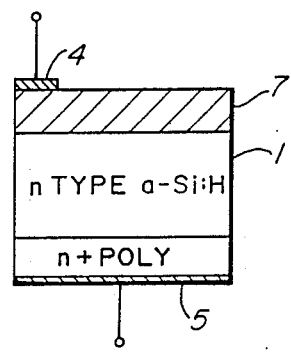
FIG. 1C
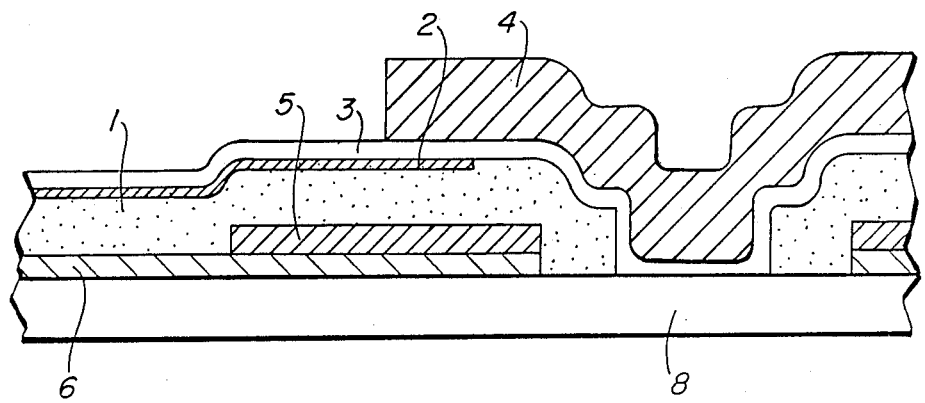
FIG. 2

PHOTOSENSITIVE DIODE ELEMENT AND ARRAY

This application is a continuation application of application Ser. No. 908,666, filed Sept. 17, 1986, now abandoned.

FIELD OF THE INVENTION

This invention relates in general to photosensitive devices, and more particularly to a photosensitive diode element comprised of hydrogenated amorphous-silicon.

Modern day opto-electronic research has resulted in numerous developments utilizing photosensitive devices. Considerable research has been undertaken in developing photosensitive or photovoltaic arrays comprised of a plurality of such photosensitive detectors. Photosensitive arrays have numerous applications in the fields of telecommunications (e.g. optical fibers and integrated optics or image transmitting devices), domestic video processing (e.g. solid state cameras), and industrial applications (e.g. photocopying and facsimile equipment).

DESCRIPTION OF THE RELATED ART

Prior art photosensitive arrays typically utilized Charge Coupled Devices (CCDs) built on crystalline silicon. Such arrays are characterized by complex structures which result in small photosensitive surface areas, and typically require a large number of processing steps for fabrication. Also, the sensitivity of CCD arrays has been found to be poor for short wavelengths of light (blue and ultraviolet). Numerous additional disadvantages of CCD arrays have been identified, as follows; the requirement for complex clock control circuitry, limited dynamic range, limited spectral and illumination intensity sensitivity, susceptibility to crosstalk between adjacent elements, saturation due to a low maximum of admissible light intensity, lack of linearity in response to illumination and compensation problems for overcoming high dark current.

SUMMARY OF THE INVENTION

According to the present invention, there is provided a photosensitive diode element fabricated from hydrogenated amorphous-silicon (a-Si:H) which overcomes the various disadvantages of prior art CCD devices discussed above. Hydrogenated amorphous-silicon is a semiconductor material having very high photoconductivity, typically in the vicinity of $10^4$. Depending upon the fabrication process utilized, the optical gap for a-Si:H is variable between 1.5 eV and 2.2 eV, whereas the optical energy gap for crystalline silicon is constant, in the vicinity of 1.1 eV. Consequently, the sensitivity of hydrogenated amorphous silicon to various light wavelengths can be tuned for optimum performance under specific lighting conditions.

As a result of its amorphous structure, the optical absorption properties of a-Si:H are superior to those of crystalline silicon from which prior art CCD elements were typically fabricated. Approximately one hundred times thinner films are required to absorb a predetermined quantity of light in the visible range when utilizing a-Si:H than when utilizing crystalline silicon. For example, a 1 micron thick layer of a-Si:H will absorb approximately 95% of visible light, whereas an approximately 100 micron thick layer of crystalline silicon would be required to achieve the same amount of absorption.

As a result of the requirement for only a relatively thin film to fabricate a photosensitive element utilizing hydrogenated amorphous-silicon, high efficiency photosensitive arrays may be fabricated therefrom. Metallization contacts can be disposed on the underside of each element resulting in isolation of array elements and straightforward access or addressing of each element.

BRIEF DESCRIPTION OF THE DRAWINGS

A better understanding of the invention will be obtained with reference to the detailed description below in conjunction with the following drawings, in which:

FIG. 1A is a simplified cross sectional view of a photosensitive diode element according to a first embodiment of the present invention in its most general form, FIG. 1B is a simplified graph of the I-V characteristic of the diode element illustrated in FIG. 1A, FIG. 1C is a simplified cross sectional view of a photosensitive diode element according to a second embodiment of the present invention, FIG. 2 is a detailed cross sectional view of a photosensitive diode element according to a preferred embodiment of the present invention.

DESCRIPTION OF THE PREFERRED EMBODIMENTS

Figure 3:
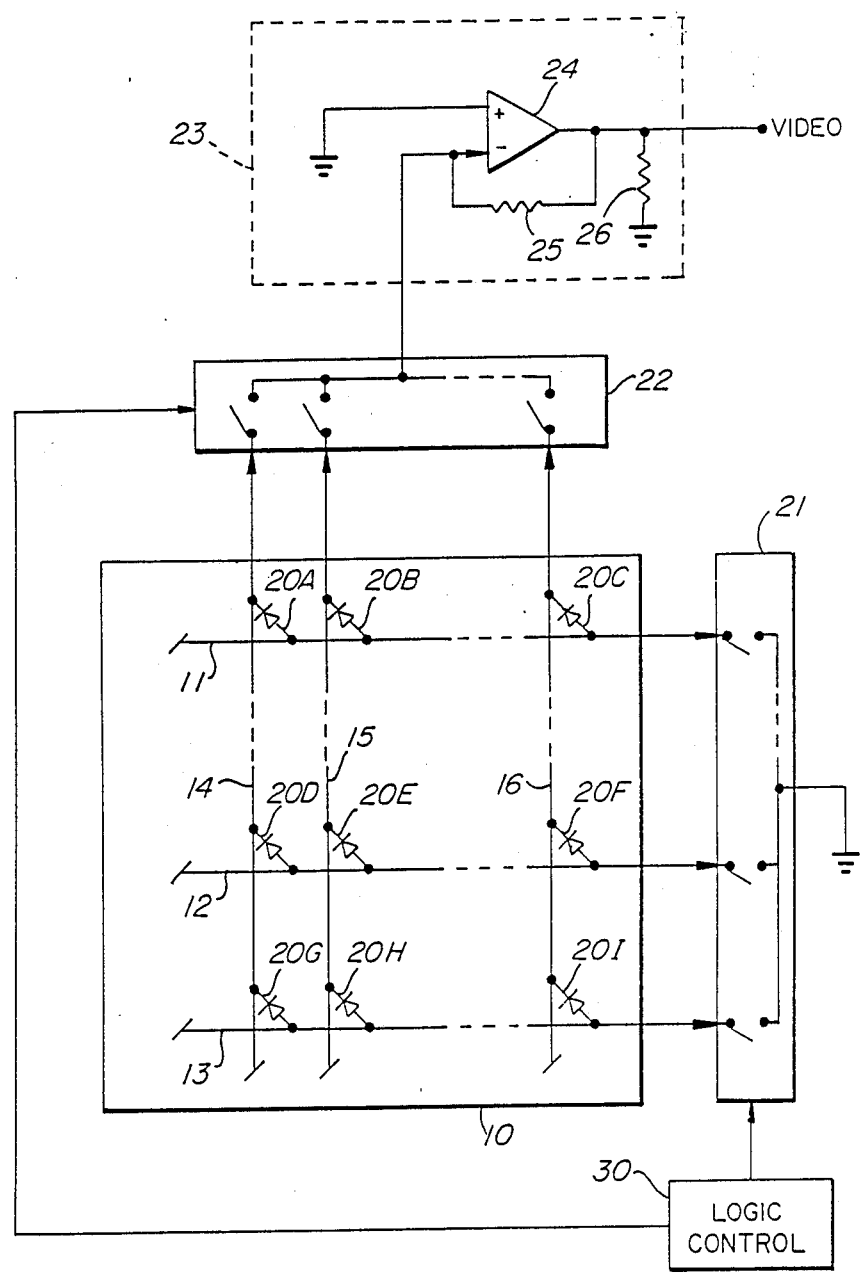
FIG. 3 is a block schematic diagram of a photosensitive diode array comprised of photosensitive diode elements according to the present invention.

With reference to FIG. 1A, a photosensitive diode element is illustrated, comprised of a cathode 1 fabricated from n-type hydrogenated amorphous-silicon, and an anode 2 of p+ type hydrogenated amorphous-silicon, preferably implanted in the n-type cathode by well known means of ion implantation, etc.

A layer of pyroglass 3 provides a transparent coating over the p+ type anode 2 and an external contact 4 is connected to the anode 2 through the pyroglass layer 3.

A contact 5 is disposed underneath the diode element and connected to cathode 1 via a highly doped layer of n+ polysilicon 6, forming an ohmic contact between the cathode and metal comprising the contact 5.

It is well known from semiconductor electronic theory that current flows across a p-n junction due to drift of minority carriers generated thermally within a diffusion length of each side of the junction. The minority carriers (e.g. electrons and holes) diffuse to the transition region surrounding the junction and are swept thereacross via the junction electric field. In the event the junction is illuminated by photons having energy greater than the gap energy ($E_g$) of the semiconductor material, an additional current flows due to Electron Hole Pair (EHP) generation.

Accordingly, in the event there is an open circuit across the photosensitive diode element illustrated in FIG. 1A, and the anode 2 and cathode 1 are exposed to illumination through pyroglass layer 3, optical generation of minority carriers results in an open circuit voltage developing between contacts 4 and 5. As the minority concentration is increased by optical generation of EHPs, the open circuit voltage increases until it reaches a limit equal to the equilibrium contact potential which is the maximum forward bias which may appear across the junction. The appearance of a forward voltage across an illuminated junction is known as the photovoltaic effect.

Depending upon the intended application, the photosensitive diode element of FIG. 1A can be operated in either of the third or fourth quadrants of its I-V characteristic, as shown in FIG. 1B. In the fourth quadrant, the junction voltage is positive and the current is negative across the diode element as a result of the aforementioned optically generated current. In this case, power is delivered by the element in proportion to the amount of illumination. The generated power can be applied to external circuitry connected to contacts 4 and 5.

FIG. 1C illustrates a further embodiment wherein a Schottky barrier is formed by depositing a layer of transparent metal 7, such as gold, aluminum, chromium or platinum over the n-type layer of a-Si:H, as an alternative to ion implantation of a p+ anode. In all other respects the embodiment of FIG. 1C functions substantially as described above with reference to FIGS. 1A and 1B.

With reference to FIG. 2, a detailed cross sectional view of a photosensitive diode element according to either of FIGS. 1A or 1C, is shown in detail.

According to the preferred method of fabrication, a first layer of pyroglass (oxide) 8 is deposited to a thickness of approximately 0.8 microns. Subsequently, the aforementioned layer of n+ polysilicon 6 is deposited to a thickness of approximately 0.3 microns. The layer of n+ polysilicon 6 is then masked and etched according to well known techniques.

Next, the first layer of metallization 5 (metal I) is deposited to a thickness of approximately 0.3 microns and subsequently masked and etched. The metallization layer 5 extends beneath subsequently deposited layers, to an external cathode contact point (not shown) for connection externally of the diode element. Metallization layer 5 permits end-point detection during etching of the amorphous-silicon layer 1 in order to stop etching at the polysilicon surface.

The cathode layer of n-type hydrogenated amorphous-silicon 1 is then deposited to a thickness of preferably 0.8 microns, and subsequently masked and etched, wherein metallization layer 5 functions as an etch-stop barrier.

The next fabrication step comprises establishing a p+ type layer 2 over the n-type cathode 1, thereby forming an anode. As discussed above with reference to FIGS. 1A and 1C, the anode layer may be implanted via well known ion implantation techniques or alternatively a thin transparent metallization layer may be deposited on top of the cathode layer 1, forming a Schottky p-n barrier, and then masked and etched. In any event, the anode layer is preferably of approximately 0.01 microns in thickness. The Schottky type structures are preferred when higher blue and ultraviolet sensitivities are required.

A layer of pyroglass 3 is deposited over the entire profile of previous layers, to a thickness of approximately 0.2 microns, and a contact mask and etching step is then performed for contacting the p+ type anode layer.

The purpose of pyroglass layer 3 is to passivate the diode element, i.e. protect it against moisture, corrosion, etc. The pyroglass layer 3 also functions as an antireflecting coating for maximum light transmission to the device. According to the theory of multilayer films, the reflectance R of a quarter-wave film such as provided by layer 3, is given by:

$$R = \left(\frac{n_t - n_1^2}{n_t + n_1^2}\right)^2$$

where $n_t$ and $n_l$ are the refractive indices of the substrate layer and the antireflective quarter-wave film, respectively. According to a successful prototype of the present invention, for a wavelength of approximately 0.7 $\mu$m, the pyroglass layer 3 was required to be approximately 0.18 $\mu$m thick; where $n_t \approx 1.87$ and $n_l \approx 1.5$.

Lastly, an anode metallization layer 4 is deposited over the pyroglass layer 3 to a layer of approximately 0.8 microns and connects the p+ type anode layer through the hole etched through the contact mask. The final metallization layer 4 is patterned to form a series of openings for exposing the hydrogenated amorphous-silicon layers to illumination.

Preferably, a plurality of the photosensitive diode elements of FIG. 2 are fabricated on a single chip to form an array or matrix as illustrated with reference to FIG. 3.

A photosensitive diode array 10 is shown comprised of a plurality of row conductors 11, . . . 12, 13, a plurality of column conductors 14, 15, . . . 16 and a plurality of diodes 20A–20I, etc., disposed at the intersections of respective ones of the row and column conductors. Each of the row conductors corresponds to a metallization layer 4 as discussed above with reference to FIG. 2, while the column conductors correspond to metallization layer 5.

A plurality of row contact switches 21 are connected to respective ones of the row conductors 11, . . . 12, 13 and to ground. Similarly, a further plurality of switches 22 are connected to respective ones of the column conductors 14, 15, . . . 16 and to the input of a detector circuit 23.

Detector circuit 23 is preferably comprised of a differential amplifier 24 having an inverting input thereof connected to a node connecting a common terminal of each of the plurality of switches 22, and a non-inverting input thereof connected to ground. A feedback resistor 25 is connected between an output of differential amplifier 24 and the inverting input thereof, and an output resistor 26 is connected from the output of the differential amplifier 24 to ground. Also, the output of amplifier 24 is connected to a VIDEO output terminal for carrying a generated video output signal.

In a successful prototype of the array, feedback resistor 25 and output resistor 26 were 1M ohm and 50 ohm resistors, respectively.

A logic control circuit 30 is connected to the row and column switches 21 and 22 respectively, for closing successive pairs of row and column switches, thereby addressing individual ones of the diode elements.

In operation, upon closure of a predetermined pair of row and column switches, a predetermined one of the diode elements 20A–20I, is addressed such that the anode terminal thereof is connected to ground via a corresponding one of switches 21 and the cathode terminal is connected to detector 23 via a corresponding one of switches 22.

The amount of optically generated current is measured by the detector 23, wherein the current is proportional to the amount of light absorbed by the addressed diode element. Successive ones of the diode elements are addressed via control circuit 30 such that a video output signal is generated via detector 23 corresponding to the amount of light impinging upon the various elements of diode array 10.

In summary, the photosensitive diode element according to the present invention and the resulting array made therefrom, are characterized by simple fabrication and structure, straightforward addressing of each element via, for instance, shift registers, and a wide dynamic range (typically in the vicinity of 1:10,000). In addition, the blue and ultraviolet sensitivity of a-Si:H has been found to be superior to crystalline silicon. The maximum sensitivity to various frequencies can be tuned and the light sensitive surface of each element can be maximized for a given element geometry as a result of patterning metallization layer 4 to accommodate a plurality of openings, and extending metallization layer 5 underneath the element.

Elements in array 10 are typically isolated as shown in FIG. 2, thereby overcoming the problem of crosstalk between adjacent elements characteristic of prior art CCD devices. The photosensitive diode element as utilized in array 10 operates in a current mode wherein the diode is loaded, resulting in very linear response.

A person skilled in the art understanding the present invention may conceive of alternative embodiments or modifications therein. All such modifications are believed to be within the sphere and scope of the present invention as defined by the claims appended hereto.

I claim:
1. A photosensitive diode element comprising:
   (a) a planar supporting substrate formed of insulating material;
   (b) a layer of conductive material disposed on the supporting substrate;
   (c) a first layer, of n-type hydrogenated amorphous-silicon, disposed on the layer of conductive material, forming a cathode;
   (d) a second layer, of p-type hydrogenated amorphous-silicon, disposed on the layer of n-type hydrogenated amorphous-silicon, forming an anode, the anode being sufficiently thin to allow energy to pass therethrough to the cathode;
   (e) a transparent passivating layer enclosing the entire upper surface of the diode element, disposed over the anode; and
   (f) a first metal contact layer disposed over the passivating layer along an edge of and over the anode, contacting the anode through the passivating layer.

2. A photosensitive diode element as defined in claim 1, wherein said second layer is comprised of implanted p+ material incorporated within said first layer.

3. A photosensitive diode element as defined in claim 2, wherein the planar supporting substrate includes an oxide substrate layer underlying said first and second layers.

4. A photosensitive diode element as defined in claim 2, wherein the planar supporting substrate includes a pyroglass substrate layer underlying said first and second layers.

5. A photosensitive diode array comprising a plurality of photosensitive diode elements as defined in claim 1, arranged according to a matrix comprised of a first plurality of column conductors and a second plurality of row conductors overlying said column conductors, respective ones of said diode elements interconnecting each of said row and column conductors, the cathode of each of said diode elements being connected to a corresponding column conductor and the anode being connected to a corresponding row conductor.

6. A photosensitive diode array as defined in claim 5, further including means for addressing individual ones of said diode elements via said row and column conductors, and detector means for detecting photoconduction in predetermined ones of said addressed elements and generating a video output signal in response thereto.

7. A photosensitive diode array as defined in claim 6, wherein said means for addressing is comprised of a first plurality of switches for connecting respective ones of said row conductors to ground, a further plurality of switches for connecting respective ones of said column conductors to said detector means, and logic control circuitry for selectively closing predetermined ones of said switches such that respective ones of said diode elements are successively connected in series with ground and said detector means, effecting addressing thereof.

8. A photosensitive diode array as defined in claim 7, wherein said detector means is comprised of an inverting differential amplifier connected to said plurality of further switches, for amplifying current signals generated by illuminated ones of said diode elements as a result of photoconduction, and generating said video output signal in response thereto.

9. A diode element as defined in claim 1, in which the layer of conductive material is formed of n+ type polysilicon.

10. A diode element as defined in claim 9, in which the supporting substrate is formed of pyroglass.

11. A diode element as defined in claim 9, in which the passivating layer is formed of pyroglass.

12. A diode element as defined in claim 1, further including a second metal contact layer along at least one boundary of the cathode, sandwiched between the hydrogenated amorphous-silicon layer and the layer of conductive material.

13. A diode element as defined in claim 1, in which the layer of conductive material is formed of n+ type polysilicon, the supporting substrate is formed of pyroglass, the passivating layer is formed of pyroglass, and further including a second metal contact layer along at least one boundary of the cathode, sandwiched between the hydrogenated amorphous-silicon layer and the layer of conductive material.

14. A diode element as defined in claim 12, in which the anode is sufficiently thin so as to be transparent to said energy.

15. A diode element as defined in claim 12, in which the thickness of the anode is approximately 0.01 microns.

16. A photosensitive diode element, comprised of a substrate formed from n+ type material, a cathode formed from a first layer of n-type hydrogenated amorphous-silicon overlying said substrate for conducting current upon exposure of the first layer to optical energy, an anode formed from a second layer of transparent metal overlying said first layer, resulting in a Schottky barrier across the junction separating said first and second layers, for receiving and transmitting said optical energy to said first layer, whereupon said first layer conducts current in response to exposure to said optical energy, a metallization layer forming a cathode contact underlying said first layer, sandwiched between the first layer and the first substrate along at least one edge of the first layer, and a further metallization layer forming an anode contact overlying said second layer and having at least one opening therein for exposing said first and second layers to said optical energy, and a layer of pyroglass covering said second layer and sandwiched between said second layer and the further metallization layer for passivating said diode element and acting as an anti-reflective coating, the further metallization layer being electrically connected to the second layer through the layer of pyroglass.

17. A photosensitive diode element as defined in claim 16, further including a supporting oxide substrate layer underlying said first layer and said first substrate.

18. A photosensitive diode element as defined in claim 16, further including a supporting pyroglass substrate layer underlying said first layer and said first substrate.

19. A photosensitive diode array comprising a plurality of photosensitive diode elements as defined in claim 16, arranged according to a matrix comprised of a first plurality of column conductors and a second plurality of row conductors overlying said column conductors, respective diode elements interconnecting each of said row and column conductors, the cathode of each of said diode elements being connected to a corresponding column conductor and the anode being connected to a corresponding row conductor.

20. A photosensitive diode array as defined in claim 19 further including means for addressing individual ones of said diode elements via said row and column conductors, and detector means for detecting photoconduction in predetermined addressed elements and generating a video output signal in response thereto.

21. A photosensitive diode array as defined in claim 20, wherein said means for addressing is comprised of a first plurality of switches for connecting respective row conductors to ground, a further plurality of switches for connecting respective column conductors to said detector means, and logic control circuitry for selectively closing predetermined switches such that respective diode elements are successively connected in series with ground and said detector means, effecting addressing thereof.

22. A photosensitive diode array as defined in claim 21, wherein said detector means is comprised of an inverting differential amplifier connected to said plurality of further switches, for amplifying current signals generated by illuminated diode elements as a result of photoconduction, and generating said video output signal in response thereto.

* * * * *